United States Patent
Chin et al.

(10) Patent No.: US 7,085,616 B2
(45) Date of Patent: Aug. 1, 2006

(54) ATOMIC LAYER DEPOSITION APPARATUS

(75) Inventors: Barry L. Chin, Saratoga, CA (US); Alfred W. Mak, Union City, CA (US); Lawrence Chung-Lai Lei, Milpitas, CA (US); Ming Xi, Palo Alto, CA (US); Hua Chung, San Jose, CA (US); Ken Kaung Lai, Milpitas, CA (US); Jeong Soo Byun, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/917,842

(22) Filed: Jul. 27, 2001

(65) Prior Publication Data

US 2003/0023338 A1  Jan. 30, 2003

(51) Int. Cl.
*G06F 19/00*  (2006.01)

(52) U.S. Cl. .................... 700/121; 438/478; 118/719; 118/729

(58) Field of Classification Search ............... 700/121; 118/719, 715, 729; 438/478, 680; 205/80
See application file for complete search history.

(56) References Cited

U.S. PATENT DOCUMENTS

| | | | |
|---|---|---|---|
| 4,058,430 A | 11/1977 | Suntola et al. | |
| 4,389,973 A | 6/1983 | Suntola et al. | |
| 4,413,022 A | 11/1983 | Suntola et al. | |
| 4,415,275 A | 11/1983 | Dietrich | |
| 4,423,701 A * | 1/1984 | Nath et al. .................. 118/715 |
| 4,486,487 A | 12/1984 | Skarp ......................... 428/216 |
| 4,664,939 A * | 5/1987 | Ovshinsky ................... 438/62 |
| 4,761,269 A | 8/1988 | Conger et al. | |
| 4,767,494 A | 8/1988 | Kobayashi et al. ......... 156/606 |
| 4,806,321 A | 2/1989 | Nishizawa et al. ......... 422/245 |
| 4,813,846 A | 3/1989 | Helms ..................... 414/744.1 |
| 4,829,022 A | 5/1989 | Kobayashi et al. ......... 437/107 |
| 4,834,831 A | 5/1989 | Nishizawa et al. | |
| 4,838,983 A | 6/1989 | Schumaker et al. ........ 156/613 |
| 4,838,993 A | 6/1989 | Aoki et al. ................. 156/643 |
| 4,840,921 A | 6/1989 | Matsumoto .................. 437/89 |
| 4,845,049 A | 7/1989 | Sunakawa .................... 437/81 |
| 4,859,307 A | 8/1989 | Nishizawa et al. ........... 437/81 |
| 4,859,627 A | 8/1989 | Sunakawa .................... 437/81 |
| 4,861,417 A | 8/1989 | Mochizuki et al. ......... 156/610 |
| 4,876,218 A | 10/1989 | Pessa et al. ................. 437/107 |
| 4,917,556 A | 4/1990 | Stark et al. ................. 414/217 |

(Continued)

FOREIGN PATENT DOCUMENTS

DE  196 27 017  1/1997

(Continued)

OTHER PUBLICATIONS

Hultman, et al., "Review of the thermal and mechanical stability of TiN-based thin films", *Zeitschrift Fur Metallkunde*, 90(10) (Oct. 1999), pp. 803-813.

(Continued)

*Primary Examiner*—Leo Picard
*Assistant Examiner*—Alexander Kosowski
(74) *Attorney, Agent, or Firm*—Patterson & Sheridan LLP

(57) ABSTRACT

A method and apparatus for atomic layer deposition (ALD) is described. The apparatus comprises a deposition chamber and a wafer support. The deposition chamber is divided into two or more deposition regions that are integrally connected one to another. The wafer support is movable between the two or more interconnected deposition regions within the deposition chamber.

39 Claims, 4 Drawing Sheets

U.S. PATENT DOCUMENTS

| | | | |
|---|---|---|---|
| 4,927,670 A | 5/1990 | Erbil | 427/255.3 |
| 4,931,132 A | 6/1990 | Aspnes et al. | 156/601 |
| 4,951,601 A | 8/1990 | Maydan et al. | 118/719 |
| 4,960,720 A | 10/1990 | Shimbo | 437/105 |
| 4,975,252 A | 12/1990 | Nishizawa et al. | |
| 4,993,357 A | 2/1991 | Scholz | |
| 5,000,113 A | 3/1991 | Wang et al. | 118/723 |
| 5,013,683 A | 5/1991 | Petroff et al. | 437/110 |
| 5,027,746 A | 7/1991 | Frijlink et al. | |
| 5,028,565 A | 7/1991 | Chang et al. | 437/192 |
| 5,082,798 A | 1/1992 | Arimoto | 437/108 |
| 5,085,885 A | 2/1992 | Foley et al. | 477/38 |
| 5,091,320 A | 2/1992 | Aspnes et al. | 437/8 |
| 5,130,269 A | 7/1992 | Kitahara et al. | 437/111 |
| 5,166,092 A | 11/1992 | Mochizuki et al. | 437/105 |
| 5,173,327 A | 12/1992 | Sandhu et al. | |
| 5,173,474 A | 12/1992 | Connell et al. | 505/1 |
| 5,186,718 A | 2/1993 | Tepman et al. | 29/25.01 |
| 5,205,077 A | 4/1993 | Wittstock | 51/165 R |
| 5,225,366 A | 7/1993 | Yoder | |
| 5,234,561 A | 8/1993 | Randhawa et al. | 204/192.38 |
| 5,246,536 A | 9/1993 | Nishizawa et al. | 156/610 |
| 5,250,148 A | 10/1993 | Nishizawa et al. | 156/611 |
| 5,254,207 A | 10/1993 | Nishizawa et al. | 156/601 |
| 5,256,244 A | 10/1993 | Ackerman | 156/613 |
| 5,259,881 A | 11/1993 | Edwards et al. | 118/719 |
| 5,261,959 A | 11/1993 | Gasworth | |
| 5,270,247 A | 12/1993 | Sakuma et al. | 437/133 |
| 5,278,435 A | 1/1994 | Van Hove et al. | 257/184 |
| 5,281,274 A | 1/1994 | Yoder | |
| 5,286,296 A | 2/1994 | Sato et al. | 118/719 |
| 5,290,748 A | 3/1994 | Knuuttila et al. | 502/228 |
| 5,294,286 A | 3/1994 | Nishizawa et al. | |
| 5,296,403 A | 3/1994 | Nishizawa et al. | 437/133 |
| 5,300,186 A | 4/1994 | Kitahara et al. | 156/613 |
| 5,311,055 A | 5/1994 | Goodman et al. | 257/593 |
| 5,316,615 A | 5/1994 | Copel | 117/95 |
| 5,316,793 A | 5/1994 | Wallace et al. | 427/248.1 |
| 5,330,610 A | 7/1994 | Eres et al. | 117/86 |
| 5,336,324 A | 8/1994 | Stall et al. | 118/719 |
| 5,338,362 A | 8/1994 | Imahashi | |
| 5,338,389 A | 8/1994 | Nishizawa et al. | 117/89 |
| 5,348,911 A | 9/1994 | Jurgensen et al. | 117/91 |
| 5,374,570 A | 12/1994 | Nasu et al. | |
| 5,384,008 A * | 1/1995 | Sinha et al. | 438/694 |
| 5,395,791 A | 3/1995 | Cheng et al. | 437/105 |
| 5,438,952 A | 8/1995 | Otsuka | 117/84 |
| 5,439,876 A | 8/1995 | Graf et al. | 505/447 |
| 5,441,703 A | 8/1995 | Jurgensen | |
| 5,443,033 A | 8/1995 | Nishizawa et al. | 117/86 |
| 5,443,647 A | 8/1995 | Aucoin et al. | |
| 5,455,072 A | 10/1995 | Bension et al. | 427/255.7 |
| 5,458,084 A | 10/1995 | Thorne et al. | 117/89 |
| 5,469,806 A | 11/1995 | Mochizuki et al. | 117/97 |
| 5,480,818 A | 1/1996 | Matsumoto et al. | |
| 5,483,919 A | 1/1996 | Yokoyama et al. | |
| 5,484,664 A | 1/1996 | Kitahara et al. | 428/641 |
| 5,503,875 A | 4/1996 | Imai et al. | |
| 5,518,542 A * | 5/1996 | Matsukawa et al. | 118/52 |
| 5,521,126 A | 5/1996 | Okamura et al. | 437/235 |
| 5,527,733 A | 6/1996 | Nishizawa et al. | 437/160 |
| 5,532,511 A | 7/1996 | Nishizawa et al. | 257/627 |
| 5,540,783 A | 7/1996 | Eres et al. | 118/725 |
| 5,580,380 A | 12/1996 | Liu et al. | 117/86 |
| 5,601,651 A | 2/1997 | Watabe | 118/715 |
| 5,609,689 A | 3/1997 | Kato et al. | 118/719 |
| 5,616,181 A | 4/1997 | Yamamoto et al. | 118/723 ER |
| 5,637,530 A | 6/1997 | Gaines et al. | 114/105 |
| 5,641,984 A | 6/1997 | Aftergut et al. | 257/433 |
| 5,644,128 A | 7/1997 | Wollnik et al. | 250/251 |
| 5,667,592 A | 9/1997 | Boitnott et al. | 118/719 |
| 5,674,786 A | 10/1997 | Turner et al. | |
| 5,693,139 A | 12/1997 | Nishizawa et al. | 117/89 |
| 5,695,564 A | 12/1997 | Imahashi | 118/719 |
| 5,705,224 A | 1/1998 | Murota et al. | 427/248.1 |
| 5,707,880 A | 1/1998 | Aftergut et al. | 437/3 |
| 5,711,811 A | 1/1998 | Suntola et al. | |
| 5,730,801 A | 3/1998 | Tepman et al. | 118/719 |
| 5,730,802 A | 3/1998 | Ishizumi et al. | |
| 5,747,113 A | 5/1998 | Tsai | 427/255.5 |
| 5,749,974 A | 5/1998 | Habuka et al. | 118/725 |
| 5,788,447 A | 8/1998 | Yonemitsu et al. | 414/217 |
| 5,788,799 A | 8/1998 | Steger et al. | 156/345 |
| 5,796,116 A | 8/1998 | Nakata et al. | |
| 5,801,634 A | 9/1998 | Young et al. | 340/635 |
| 5,807,792 A | 9/1998 | Ilg et al. | |
| 5,830,270 A | 11/1998 | McKee et al. | 117/106 |
| 5,835,677 A | 11/1998 | Li et al. | |
| 5,851,849 A | 12/1998 | Comizzoli et al. | 438/38 |
| 5,855,675 A | 1/1999 | Doering et al. | 118/719 |
| 5,855,680 A | 1/1999 | Soininen et al. | |
| 5,856,219 A | 1/1999 | Naito et al. | 438/241 |
| 5,858,102 A | 1/1999 | Tsai | 118/719 |
| 5,866,213 A | 2/1999 | Foster et al. | 427/573 |
| 5,866,795 A | 2/1999 | Wang et al. | 73/1.36 |
| 5,879,459 A | 3/1999 | Gadgil et al. | |
| 5,882,165 A | 3/1999 | Maydan et al. | 474/217 |
| 5,882,413 A | 3/1999 | Beaulieu et al. | 118/719 |
| 5,904,565 A | 5/1999 | Nguyen et al. | 438/687 |
| 5,916,365 A * | 6/1999 | Sherman | 117/92 |
| 5,923,056 A | 7/1999 | Lee et al. | 257/192 |
| 5,923,985 A | 7/1999 | Aoki et al. | 438/301 |
| 5,925,574 A | 7/1999 | Aoki et al. | 437/31 |
| 5,928,389 A | 7/1999 | Jevtic | 29/25.01 |
| 5,942,040 A | 8/1999 | Kim et al. | 118/726 |
| 5,947,710 A | 9/1999 | Cooper et al. | 418/63 |
| 5,972,430 A | 10/1999 | DiMeo, Jr. et al. | 427/255.32 |
| 6,001,669 A | 12/1999 | Gaines et al. | 438/102 |
| 6,015,590 A | 1/2000 | Suntola et al. | |
| 6,025,627 A | 2/2000 | Forbes et al. | 257/321 |
| 6,026,589 A | 2/2000 | Yao et al. | 34/78 |
| 6,036,773 A | 3/2000 | Wang et al. | 117/97 |
| 6,042,652 A | 3/2000 | Hyun et al. | |
| 6,043,177 A | 3/2000 | Falconer et al. | 502/4 |
| 6,051,286 A | 4/2000 | Zhao et al. | 427/576 |
| 6,062,798 A | 5/2000 | Muka | 414/416 |
| 6,071,572 A | 6/2000 | Mosely et al. | |
| 6,071,808 A | 6/2000 | Merchant et al. | 438/633 |
| 6,084,302 A | 7/2000 | Sandhu | 257/751 |
| 6,086,677 A | 7/2000 | Umotoy et al. | 118/715 |
| 6,110,556 A | 8/2000 | Bang et al. | 428/64.1 |
| 6,113,977 A | 9/2000 | Soininen et al. | 427/64 |
| 6,117,244 A | 9/2000 | Bang et al. | 118/715 |
| 6,124,158 A | 9/2000 | Dautartas et al. | 438/216 |
| 6,130,147 A | 10/2000 | Major et al. | 438/604 |
| 6,139,695 A * | 10/2000 | Washburn et al. | 204/192.12 |
| 6,139,700 A | 10/2000 | Kang et al. | |
| 6,140,237 A | 10/2000 | Chan et al. | 438/687 |
| 6,140,238 A | 10/2000 | Kitch | 438/687 |
| 6,143,082 A | 11/2000 | McInerney et al. | 118/719 |
| 6,143,659 A | 11/2000 | Leem | 438/688 |
| 6,144,060 A | 11/2000 | Park et al. | 257/310 |
| 6,158,446 A | 12/2000 | Mohindra et al. | 134/25.4 |
| 6,174,377 B1 | 1/2001 | Doering et al. | |
| 6,174,809 B1 | 1/2001 | Kang et al. | 438/682 |
| 6,178,660 B1 * | 1/2001 | Emmi et al. | 34/412 |
| 6,183,563 B1 | 2/2001 | Choi et al. | |
| 6,197,683 B1 | 3/2001 | Kang et al. | |
| 6,200,441 B1 * | 3/2001 | Gornicki et al. | 204/298.25 |
| 6,200,893 B1 | 3/2001 | Sneh | |
| 6,203,613 B1 | 3/2001 | Gates et al. | 117/104 |
| 6,206,967 B1 | 3/2001 | Mak et al. | 118/666 |
| 6,207,302 B1 | 3/2001 | Sugiura et al. | 428/690 |
| 6,231,672 B1 | 5/2001 | Choi et al. | |

| | | |
|---|---|---|
| 6,248,605 B1 | 6/2001 | Harkonen et al. ............ 438/29 |
| 6,270,572 B1 | 8/2001 | Kim et al. |
| 6,271,148 B1 | 8/2001 | Kao et al. .................... 438/727 |
| 6,281,098 B1* | 8/2001 | Wang et al. ................. 438/488 |
| 6,287,965 B1 | 9/2001 | Kang et al. .................. 438/648 |
| 6,291,876 B1 | 9/2001 | Stumborg et al. ........... 257/632 |
| 6,302,965 B1 | 10/2001 | Umotoy et al. |
| 6,305,314 B1 | 10/2001 | Sneh et al. |
| 6,306,216 B1 | 10/2001 | Kim et al. |
| 6,316,098 B1 | 11/2001 | Yitzchaik et al. ........... 428/339 |
| 6,319,553 B1 | 11/2001 | McInerney et al. ......... 427/250 |
| 6,342,277 B1 | 1/2002 | Sherman ...................... 427/562 |
| 6,365,025 B1* | 4/2002 | Ting et al. ..................... 205/80 |
| 6,387,185 B1* | 5/2002 | Doering et al. ............. 118/729 |
| 6,432,231 B1 | 8/2002 | Nielson et al. |
| 6,447,607 B1 | 9/2002 | Soininen et al. |
| 6,451,119 B1 | 9/2002 | Sneh et al. |
| 6,455,098 B1* | 9/2002 | Tran et al. ....................... 427/8 |
| 6,478,872 B1 | 11/2002 | Chae et al. |
| 6,481,945 B1 | 11/2002 | Hasper et al. |
| 6,497,767 B1* | 12/2002 | Okase et al. ................. 118/666 |
| 6,511,539 B1 | 1/2003 | Raaijmakers |
| 6,551,406 B1 | 4/2003 | Kilpi |
| 6,572,705 B1 | 6/2003 | Suntola et al. |
| 6,573,182 B1 | 6/2003 | Sandhu et al. |
| 6,578,287 B1 | 6/2003 | Aswad |
| 6,579,372 B1 | 6/2003 | Park |
| 6,579,374 B1 | 6/2003 | Bondestam et al. |
| 6,593,484 B1 | 7/2003 | Yasuhara et al. |
| 6,613,656 B1 | 9/2003 | Li |
| 6,630,030 B1 | 10/2003 | Suntola et al. |
| 6,630,201 B1 | 10/2003 | Chiang et al. |
| 6,656,273 B1* | 12/2003 | Toshima et al. ............... 118/56 |
| 6,660,126 B1 | 12/2003 | Nguyen et al. |
| 6,716,287 B1 | 4/2004 | Santiago et al. |
| 6,718,126 B1 | 4/2004 | Lei |
| 6,734,020 B1 | 5/2004 | Lu et al. |
| 6,772,072 B1 | 8/2004 | Ganguli et al. |
| 6,773,507 B1 | 8/2004 | Jallepally et al. |
| 6,777,352 B1 | 8/2004 | Tepman et al. |
| 6,778,762 B1 | 8/2004 | Shareef et al. |
| 6,815,285 B1 | 11/2004 | Choi et al. |
| 6,818,094 B1 | 11/2004 | Yudovsky |
| 6,821,563 B1 | 11/2004 | Yudovsky |
| 6,866,746 B1 | 3/2005 | Lei et al. |
| 6,868,859 B1 | 3/2005 | Yudovsky |
| 2001/0000866 A1 | 5/2001 | Sneh et al. ............. 118/723 R |
| 2001/0009140 A1 | 7/2001 | Bondestam et al. ........ 118/725 |
| 2001/0011526 A1 | 8/2001 | Doering et al. ............. 118/729 |
| 2001/0013312 A1 | 8/2001 | Soininen et al. |
| 2001/0014371 A1 | 8/2001 | Kilpi |
| 2001/0024387 A1 | 9/2001 | Raaijmakers et al. ....... 365/200 |
| 2001/0031562 A1 | 10/2001 | Raaijmakers et al. ....... 438/770 |
| 2001/0034123 A1 | 10/2001 | Jeon et al. ................... 438/643 |
| 2001/0041250 A1 | 11/2001 | Werkhoven et al. ........ 428/212 |
| 2001/0042523 A1 | 11/2001 | Kesala |
| 2001/0042799 A1 | 11/2001 | Kim et al. ................... 239/553 |
| 2001/0054377 A1 | 12/2001 | Lindfors et al. |
| 2001/0054769 A1 | 12/2001 | Raaijmakers et al. ....... 257/758 |
| 2002/0000196 A1 | 1/2002 | Park |
| 2002/0007790 A1 | 1/2002 | Park |
| 2002/0009544 A1 | 1/2002 | McFeely et al. |
| 2002/0041931 A1 | 4/2002 | Suntola et al. |
| 2002/0052097 A1 | 5/2002 | Park |
| 2002/0066411 A1 | 6/2002 | Chiang et al. |
| 2002/0073924 A1 | 6/2002 | Chiang et al. |
| 2002/0076481 A1 | 6/2002 | Chiang et al. |
| 2002/0076507 A1 | 6/2002 | Chiang et al. |
| 2002/0076508 A1 | 6/2002 | Chiang et al. |
| 2002/0086106 A1 | 7/2002 | Park et al. |
| 2002/0092471 A1 | 7/2002 | Kang et al. |
| 2002/0094689 A1 | 7/2002 | Park |
| 2002/0104481 A1 | 8/2002 | Chiang et al. |
| 2002/0108570 A1 | 8/2002 | Lindfors |
| 2002/0121241 A1 | 9/2002 | Nguyen et al. |
| 2002/0121342 A1 | 9/2002 | Nguyen et al. |
| 2002/0127745 A1 | 9/2002 | Lu et al. |
| 2002/0134307 A1 | 9/2002 | Choi |
| 2002/0144655 A1 | 10/2002 | Chiang et al. |
| 2002/0144657 A1 | 10/2002 | Chiang et al. |
| 2002/0146511 A1 | 10/2002 | Chiang et al. |
| 2002/0195056 A1* | 12/2002 | Sandhu et al. ............... 118/719 |
| 2003/0004723 A1 | 1/2003 | Chihara |
| 2003/0010451 A1 | 1/2003 | Tzu et al. |
| 2003/0017697 A1 | 1/2003 | Choi et al. |
| 2003/0022338 A1 | 1/2003 | Ruben et al. |
| 2003/0042630 A1 | 3/2003 | Babcoke et al. |
| 2003/0053799 A1 | 3/2003 | Lei |
| 2003/0057527 A1 | 3/2003 | Chung et al. |
| 2003/0072913 A1 | 4/2003 | Chou et al. |
| 2003/0075273 A1 | 4/2003 | Kilpela et al. |
| 2003/0075925 A1 | 4/2003 | Lindfors et al. |
| 2003/0079686 A1 | 5/2003 | Chen et al. |
| 2003/0089308 A1 | 5/2003 | Raaijmakers |
| 2003/0101927 A1 | 6/2003 | Raaijmakers |
| 2003/0101938 A1 | 6/2003 | Ronsse et al. |
| 2003/0105490 A1 | 6/2003 | Jallepally et al. |
| 2003/0113187 A1 | 6/2003 | Lei et al. |
| 2003/0116087 A1 | 6/2003 | Nguyen et al. |
| 2003/0121469 A1 | 7/2003 | Lindfors et al. |
| 2003/0121608 A1 | 7/2003 | Chen et al. |
| 2003/0140854 A1 | 7/2003 | Kilpi |
| 2003/0143328 A1 | 7/2003 | Chen et al. |
| 2003/0143747 A1 | 7/2003 | Bondestam et al. |
| 2003/0153177 A1 | 8/2003 | Tepman et al. |
| 2003/0172872 A1 | 9/2003 | Thakur et al. |
| 2003/0194493 A1 | 10/2003 | Chang et al. |
| 2003/0198754 A1 | 10/2003 | Xi et al. |
| 2003/0213560 A1 | 11/2003 | Wang et al. |
| 2003/0216981 A1 | 11/2003 | Tillman |
| 2003/0219942 A1 | 11/2003 | Choi et al. |
| 2003/0221780 A1 | 12/2003 | Lei et al. |
| 2003/0224107 A1 | 12/2003 | Lindfors et al. |
| 2003/0235961 A1 | 12/2003 | Metzner et al. |
| 2004/0011404 A1 | 1/2004 | Ku et al. |
| 2004/0011504 A1 | 1/2004 | Ku et al. |
| 2004/0013577 A1 | 1/2004 | Ganguli et al. |
| 2004/0014320 A1 | 1/2004 | Chen et al. |
| 2004/0015300 A1 | 1/2004 | Ganguli et al. |
| 2004/0016404 A1 | 1/2004 | Gregg et al. |
| 2004/0025370 A1 | 2/2004 | Guenther |
| 2004/0065255 A1 | 4/2004 | Yang et al. |
| 2004/0069227 A1 | 4/2004 | Ku et al. |
| 2004/0071897 A1 | 4/2004 | Verplancken et al. |
| 2004/0144308 A1 | 7/2004 | Yudovsky |
| 2004/0144311 A1 | 7/2004 | Chen et al. |
| 2004/0219784 A1 | 11/2004 | Kang et al. |
| 2004/0224506 A1 | 11/2004 | Choi et al. |
| 2004/0235285 A1 | 11/2004 | Kang et al. |
| 2005/0006799 A1 | 1/2005 | Gregg et al. |
| 2005/0059240 A1 | 3/2005 | Choi et al. |
| 2005/0095859 A1 | 5/2005 | Chen et al. |
| 2005/0104142 A1 | 5/2005 | Narayanan et al. |

FOREIGN PATENT DOCUMENTS

| | | |
|---|---|---|
| DE | 198 20 147 | 7/1999 |
| EP | 0 344 352 A1 | 12/1989 |
| EP | 0 429 270 A2 | 5/1991 |
| EP | 0 442 490 A1 | 8/1991 |
| EP | 0 497 267 | 8/1992 |
| EP | 0 799 641 A2 | 10/1997 |
| EP | 1167569 | 1/2002 |
| FR | 2 626 110 | 7/1989 |
| FR | 2 692 597 | 12/1993 |
| GB | 2 355 727 A | 5/2001 |

| | | | | | |
|---|---|---|---|---|---|
| JP | 58-098917 | 6/1983 | JP | 03-286522 | 12/1991 |
| JP | 58-100419 | 6/1983 | JP | 03-286531 | 12/1991 |
| JP | 60-065712 A | 4/1985 | JP | 04-031391 | 2/1992 |
| JP | 61-035847 | 2/1986 | JP | 04-031396 | 2/1992 |
| JP | 61-210623 | 9/1986 | JP | 04-031396 A | 2/1992 |
| JP | 62-069508 | 3/1987 | JP | 04-100292 | 4/1992 |
| JP | 62-091495 A | 4/1987 | JP | 04-111418 | 4/1992 |
| JP | 62-141717 | 6/1987 | JP | 04-132214 | 5/1992 |
| JP | 62-167297 | 7/1987 | JP | 04-132681 | 5/1992 |
| JP | 62-171999 | 7/1987 | JP | 04/151822 | 5/1992 |
| JP | 62-232919 | 10/1987 | JP | 04-162418 | 6/1992 |
| JP | 63-062313 | 3/1988 | JP | 04-175299 | 6/1992 |
| JP | 63-085098 | 4/1988 | JP | 04-186824 | 7/1992 |
| JP | 63-090833 | 4/1988 | JP | 04-212411 | 8/1992 |
| JP | 63-222420 | 9/1988 | JP | 04-260696 | 9/1992 |
| JP | 63-222421 | 9/1988 | JP | 04-273120 | 9/1992 |
| JP | 63-227007 | 9/1988 | JP | 04-285167 | 10/1992 |
| JP | 63-252420 | 10/1988 | JP | 04-291916 | 10/1992 |
| JP | 63-266814 | 11/1988 | JP | 04-325500 | 11/1992 |
| JP | 64-009895 | 1/1989 | JP | 04-328874 | 11/1992 |
| JP | 64-009896 | 1/1989 | JP | 05-029228 | 2/1993 |
| JP | 64-009897 | 1/1989 | JP | 05-047665 | 2/1993 |
| JP | 64-037832 | 2/1989 | JP | 05-047666 | 2/1993 |
| JP | 64-082615 | 3/1989 | JP | 05-047668 | 2/1993 |
| JP | 64-082617 | 3/1989 | JP | 05-074717 | 3/1993 |
| JP | 64-082671 | 3/1989 | JP | 05-074724 | 3/1993 |
| JP | 64-082676 | 3/1989 | JP | 05-102189 | 4/1993 |
| JP | 01-103982 | 4/1989 | JP | 05-160152 | 6/1993 |
| JP | 01-103996 | 4/1989 | JP | 05-175143 | 7/1993 |
| JP | 64-090524 | 4/1989 | JP | 05-175145 | 7/1993 |
| JP | 01-117017 | 5/1989 | JP | 05-182906 | 7/1993 |
| JP | 01-143221 | 6/1989 | JP | 05-186295 | 7/1993 |
| JP | 01-143233 | 6/1989 | JP | 05-206036 | 8/1993 |
| JP | 01-154511 | 6/1989 | JP | 05-234899 | 9/1993 |
| JP | 01-236657 | 9/1989 | JP | 05-235047 | 9/1993 |
| JP | 01-245512 | 9/1989 | JP | 05-251339 | 9/1993 |
| JP | 01-264218 | 10/1989 | JP | 05-270997 | 10/1993 |
| JP | 01-270593 | 10/1989 | JP | 05-283336 | 10/1993 |
| JP | 01-272108 | 10/1989 | JP | 05-291152 | 11/1993 |
| JP | 01-290221 | 11/1989 | JP | 05-304334 | 11/1993 |
| JP | 01-290222 | 11/1989 | JP | 05-343327 | 12/1993 |
| JP | 01-296673 | 11/1989 | JP | 05-343685 | 12/1993 |
| JP | 01-303770 | 12/1989 | JP | 06-045606 | 2/1994 |
| JP | 01-305894 | 12/1989 | JP | 06-132236 | 5/1994 |
| JP | 01-313927 | 12/1989 | JP | 06-177381 | 6/1994 |
| JP | 02-012814 | 1/1990 | JP | 06-196809 | 7/1994 |
| JP | 02-014513 | 1/1990 | JP | 06-222388 | 8/1994 |
| JP | 02-017634 | 1/1990 | JP | 06-224138 | 8/1994 |
| JP | 02-063115 | 3/1990 | JP | 06-230421 | 8/1994 |
| JP | 02-074029 | 3/1990 | JP | 06-252057 | 9/1994 |
| JP | 02-074587 | 3/1990 | JP | 06-291048 | 10/1994 |
| JP | 02-106822 | 4/1990 | JP | 07-070752 | 3/1995 |
| JP | 02-129913 | 5/1990 | JP | 07-086269 | 3/1995 |
| JP | 02-162717 | 6/1990 | JP | 08-181076 | 7/1996 |
| JP | 02-172895 | 7/1990 | JP | 08-245291 | 9/1996 |
| JP | 02-196092 | 8/1990 | JP | 08-264530 | 10/1996 |
| JP | 02-203517 | 8/1990 | JP | 09-260786 | 10/1997 |
| JP | 02-230690 | 9/1990 | JP | 09-293681 | 11/1997 |
| JP | 02-230722 | 9/1990 | JP | 10-188840 | 7/1998 |
| JP | 02-246161 | 10/1990 | JP | 10-190128 | 7/1998 |
| JP | 02-264491 | 10/1990 | JP | 10-308283 | 11/1998 |
| JP | 02-283084 | 11/1990 | JP | 11-269652 | 10/1999 |
| JP | 02-304916 | 12/1990 | JP | 2000-031387 | 1/2000 |
| JP | 03-019211 | 1/1991 | JP | 2000-058777 | 2/2000 |
| JP | 03-022569 | 1/1991 | JP | 2000-068072 | 3/2000 |
| JP | 03-023294 | 1/1991 | JP | 2000-087029 | 3/2000 |
| JP | 03-023299 | 1/1991 | JP | 2000-138094 | 5/2000 |
| JP | 03-044967 | 2/1991 | JP | 2000-212752 | 8/2000 |
| JP | 03-048421 | 3/1991 | JP | 2000-218445 | 8/2000 |
| JP | 03-070124 | 3/1991 | JP | 2000-319772 | 11/2000 |
| JP | 03-185716 | 8/1991 | JP | 2000-340883 | 12/2000 |
| JP | 03-208885 | 9/1991 | JP | 2000-353666 | 12/2000 |
| JP | 03-234025 | 10/1991 | JP | 2001-020075 | 1/2001 |

| | | |
|---|---|---|
| JP | 2001-62244 | 3/2001 |
| JP | 2001-152339 | 6/2001 |
| JP | 2001-172767 | 6/2001 |
| JP | 2001-189312 | 7/2001 |
| JP | 2001-217206 | 8/2001 |
| JP | 2001-220287 | 8/2001 |
| JP | 2001-220294 | 8/2001 |
| JP | 2001-240972 | 9/2001 |
| JP | 2001-254181 | 9/2001 |
| JP | 2001-284042 | 10/2001 |
| JP | 2001-303251 | 10/2001 |
| JP | 2001-328900 | 11/2001 |
| JP | 2002 2060944 | 2/2002 |
| WO | 90/02216 | 3/1990 |
| WO | 91/10510 A1 | 7/1991 |
| WO | 93/02111 A1 | 2/1993 |
| WO | 96/17107 A1 | 6/1996 |
| WO | 96/18756 A1 | 6/1996 |
| WO | WO 96/17107 | 6/1996 |
| WO | 98/06889 | 2/1998 |
| WO | 98/51838 | 11/1998 |
| WO | 99/01595 | 1/1999 |
| WO | WO 99/01595 | 1/1999 |
| WO | 99/13504 | 3/1999 |
| WO | 99/29924 A1 | 6/1999 |
| WO | 99/41423 A2 | 8/1999 |
| WO | WO 99/65064 | 12/1999 |
| WO | 00/11721 | 3/2000 |
| WO | 00/15865 A1 | 3/2000 |
| WO | 00/15881 A2 | 3/2000 |
| WO | 00/16377 A2 | 3/2000 |
| WO | 00/54320 A1 | 9/2000 |
| WO | WO 00/54320 | 9/2000 |
| WO | 00/63957 A1 | 10/2000 |
| WO | 00/79019 A1 | 12/2000 |
| WO | 00/79576 A1 | 12/2000 |
| WO | WO 00/79576 | 12/2000 |
| WO | 01/15220 | 3/2001 |
| WO | 01/15220 A1 | 3/2001 |
| WO | WO 01/17692 | 3/2001 |
| WO | 01/27346 | 4/2001 |
| WO | 01/27346 A1 | 4/2001 |
| WO | 01/27347 | 4/2001 |
| WO | 01/27347 A1 | 4/2001 |
| WO | 01/29280 A1 | 4/2001 |
| WO | 01/29891 | 4/2001 |
| WO | 01/29891 A1 | 4/2001 |
| WO | 01/29893 | 4/2001 |
| WO | 01/29893 A1 | 4/2001 |
| WO | 01/36702 A1 | 5/2001 |
| WO | WO 01/36702 | 5/2001 |
| WO | 01/40541 A1 | 6/2001 |
| WO | 01/66832 A2 | 9/2001 |
| WO | WO 02/08488 | 1/2002 |
| WO | WO -2/45871 | 6/2002 |
| WO | WO 03/23835 | 3/2003 |

OTHER PUBLICATIONS

Klaus, et al., "Atomic Layer Deposition of $SiO_2$ Using Catalyzed and Uncatalyzed Self-Limiting Surface Reactions", *Surface Review & Letters*, 6(3&4) (1999), pp. 435-448.

Yamaguchi, et al., "Atomic-layer chemical-vapor-deposition of silicon dioxide films with extremely low hydrogen content", *Appl. Surf. Sci.*, vol. 130-132 (1998), pp. 202-207.

George, et al., "Surface Chemistry for Atomic Layer Growth", *J. Phys. Chem.*, vol. 100 (1996), pp. 13121-13131.

George, et al., "Atomic layer controlled deposition of $SiO_2$ and $Al_2O_3$ using ABAB . . . binary reaction sequence chemistry", *Appl. Surf. Sci.*, vol. 82/83 (1994), pp. 460-467.

Wise, et al., "Diethyldiethoxysilane as a new precursor for $SiO_2$ growth on silicon", *Mat. Res. Soc. Symp. Proc.*, vol. 334 (1994), pp. 37-43.

Niinisto, et al., "Synthesis of oxide thin films and overlayers by atomic layer epitaxy for advanced applications", *Mat. Sci. & Eng.*, vol. B41 (1996), pp. 23-29.

Ritala, et al.,"Perfectly conformal TiN and $Al_2O_3$ films deposited by atomic layer deposition", *Chemical Vapor Deposition*, vol. 5(1) (Jan. 1999), pp. 7-9.

Klaus, et al., "Atomically controlled growth of tungsten and tungsten nitride using sequential surface reactions". *Appl. Surf. Sci.*, vol. 162-163 (2000), pp. 479-491.

Min, et al., "Atomic layer deposition of TiN thin films by sequential introduction of Ti precursor and NH/sub3/", *Symp.: Advanced Interconnects and Contact Materials and Processes for Future Integrated Circuits* (Apr. 13-16, 1998), pp. 337-342.

Klaus, et al., Atomic Layer Deposition of Tungsten using Sequential Surface Chemistry with a Sacrificial Stripping Reaction, Thin Solid Films 360 (2000), pp. 145-153, (Accepted Nov. 16, 1999).

Min, et al., "Metal Organic Atomic-Layer Deposition of Titanium-Silicon-Nitride Films", *Applied Physics Letters*, American Inst. Of Physics, vol. 75(11) (Sep. 13, 1999).

Martensson, et al., "Atomic Layer Epitaxy of Copper on Tantalum", *Chemical Vapor Deposition*, 3(1) (Feb. 1, 1997), pp. 45-50.

Ritala, et al. "Atomic Layer Epitaxy Growth of TiN Thin Films", *J. Electrochem. Soc.*, 142(8) (Aug. 1995), pp. 2731-2737.

Elers, et al., "NbC15 as a precursor in atomic layer epitaxy", *Appl. Surf. Sci.*, vol. 82/83 (1994), pp. 468-474.

Lee, "The Preparation of Titanium-Based Thin Film by CVD Using Titanium Chlorides as Precursors", *Chemical Vapor Deposition*, 5(2) (Mar. 1999), pp. 69-73.

Martensson, et al., "Atomic Layer Epitaxy of Copper, Growth & Selectivity in the Cu (II)-2,2.6,6-Tetramethyl-3, 5-Heptanedion ATE/H2 Process", *J. Electrochem. Soc.*, 145(8) (Aug. 1998), pp. 2926-2931.

Min, et al., "Chemical Vapor Deposition of Ti-Si-N Films with Alternating Source Supply", *Mat., Res. Soc. Symp. Proc.*, vol. 564 (Apr. 5, 1999), pp. 207-210.

Bedair, "Atomic layer epitaxy deposition processes", *J. Vac. Sci. Techol.* 12(1) (Jan./Feb. 1994).

Yamaga, et al., "Atomic layer epitaxy of ZnS by a new gas supplying system in a low-pressure metalorganic vapor phase epitaxy", *J. of Crystal Growth* 117 (1992), pp. 152-155.

Elam, et al., "Nucleation and growth during tungsten atomic layer deposition on SiO2 surfaces," Thin Solid Films 386 (2001) pp. 41-52, (Accepted Dec. 14, 2000).

"Cluster Tools for Fabrication of Advanced devices" Jap. J. of Applied Physics, Extended Abstracts, 22nd Conference Solid State Devices and Materials (1990), pp. 849-852.

Kitigawa, et al., "Hydrogen-mediated low temperature epitaxy of Si in plasma-enhanced chemical vapor deposition", Applied Surface Science (2000), pp. 30-34.

Lee, et al., "Pulsed nucleation for ultra-high aspect ratio tungsten plugfill", Novellus Systems, Inc. (2001), pp. 1-2 (*Copy Not Available to Applicant at This Time*).

Ohba, et al., "Thermal Decomposition of Methylhydrazine and Deposition Properties of CVD TiN Thin Films", Conference Proceedings, Advanced Metallization for ULSI Applications in 1993 (1994), pp. 143-149.

Scheper, et al., "Low-temperature deposition of titanium nitride films from dialkylhydrazine-based precursors", Materials Science in Semiconductor Processing 2 (1999), pp. 149-157.

Suzuki, et al., "A 0.2-μm contact filing by 450° C-hydrazine-reduced TiN film with low resistivity", IEDM 92-979, pp. 11.8.1-11.8.3.

Suzuki, et al., "LPCVD-TiN Using Hydrazine and $TiCl_4$", VMIC Conference (Jun. 8-9, 1993), pp. 418-423.

IBM Tech. Disc. Bull. Knowledge-Based Dynamic Scheduler in Distributed Computer Control, (Jun. 1990), pp. 80-84.

IBM Tech. Disc. Bull. "Multiprocessor and Multitasking Architecture for Tool Control of the Advanced via Inspection Tools" (May 1992), pp. 190-191.

McGeachin, S., "Synthesis and properties of some β-diketimines derived from acetylacetone, and their metal complexes", Canadian J. of Chemistry, vol. 46 (1968), pp. 1903-1912.

Solanki, et al., "Atomic Layer deposition of Copper Seed Layers", Electrochemical and Solid State Letters, 3(10) (2000), pp. 479-480.

NERAC.COM Retro Search: Atomic Layer Deposition of Copper, dated Oct. 11, 2001.

NERAC.COM Retro Search: Atomic Layer Deposition / Epitaxy Aluminum Oxide Plasma, dated Oct. 2, 2001.

NERAC Search abstract of "Atomic Layer deposition of Ta and Ti for Interconnect Diffusion Barriers", by Rossnagel, et al., J. Vac. Sci. & Tech., 18(4) (Jul. 2000).

Abstracts of articles re atomic layer deposition.

Abstracts of search results re atomic layer deposition, search dated Jan. 24, 2002.

Abstracts of articles re atomic layer deposition and atomic layer nucleation.

Abstracts of articles re atomic layer deposition and semiconductors and copper.

Abstracts if articles—atomic layer deposition.

NERAC Search—Atomic Layer Deposition, search dated Oct. 16, 2001.

Bader, et al., "Integrated Processing Equipment", Solid State Technology, Cowan Pub., vol. 33, No. 5 (May 1, 1990), pp. 149-154.

Choi, et al., "The effect of annealing on resistivity of low pressure chemical vapor deposited titanium diboride", J. Appl. Phys. 69(11) (Jun. 1, 1991), pp. 7853-7861.

Choi, et al., "Stability of $TiB_2$ as a Diffusion Barrier on Silicon", J. Electrochem. Soc. 138(10) (Oct. 1991), pp. 3062-3067.

"Cluster Tools for Fabrication of Advanced devices" Jap. J. of Applied Physics, Extended Abstracts, 22$^{nd}$ Conference Solid State Devices and Materials (1990), pp. 849-852 XP000178141 (*Article on Order—to be Provided*).

"Applications of Integrated processing", Solid State Technology, US, Cowan Pub., vol. 37, No. 12 (Dec. 1, 1994), pp. 45-47.

Kitigawa, et al., "Hydrogen-mediated low temperature epitaxy of Si in plasma-enhanced chemical vapor deposition", Applied Surface Science (2000), pp. 30-34 (*Article on Order—to be Provided*).

Lee, et al., "Pulsed nucleation for ultra-high aspect ratio tungsten plugfill", Novellus Systems, Inc. (2001), pp. 1-2 (*Article on Order—to be Provided*).

Klaus, et al., "*Atomically controlled growth of tungsten and tungsten nitride using sequential surface reactions,*" Applied Surface Science 162-163 (2000) 479-491.

European Search Report dated Sep. 23, 2005 from European Application No. 03257169.7.

* cited by examiner ial layers on high aspect ratio structures. Referring to FIG. 1,
ATOMIC LAYER DEPOSITION APPARATUS

BACKGROUND OF THE INVENTION

1. Field of the Invention

The present invention relates to integrated circuit processing equipment and, more particularly to atomic layer deposition (ALD) equipment.

2. Description of the Background Art

Semiconductor wafer processing systems that perform atomic layer deposition (ALD) are used to form material layers on high aspect ratio structures. Referring to FIG. 1, ALD systems typically comprise a deposition chamber 10, a gas supply system 12, and a gas exhaust system 14. The deposition chamber includes a pedestal 11 that is used to support a substrate 13 such as a semiconductor wafer. The gas supply system 12 is used to provide reaction gases to the deposition chamber 10, and the gas exhaust system 14 is used to remove reaction gases from the deposition chamber 10.

In ALD processes, a material layer is formed on a substrate by sequentially chemisorbing alternating monolayers of two or more compounds thereon. Each of the alternating monolayers is chemisorbed onto the substrate by providing a different deposition gas to the chamber that comprises one of the two or more compounds used to form the material layer. After each monolayer is chemisorbed on the substrate, a purge gas is introduced into the deposition chamber to flush the deposition gas therefrom.

Since each of the alternating monolayers of the two or more compounds used to form the material layer is chemisorbed onto the substrate by providing a different deposition gas to the chamber followed by a purge gas, atomic layer deposition (ALD) processes are time consuming. As such, integrated circuit fabrication using ALD processes are costly due to decreased wafer throughput.

Therefore, a need exists in the art for atomic layer deposition (ALD) systems for integrated circuit fabrication.

SUMMARY OF THE INVENTION

A method and apparatus for atomic layer deposition (ALD) is described. The apparatus comprises a deposition chamber and a wafer support. The deposition chamber is divided into two or more deposition regions that are integrally connected one to another. The wafer support is movable between the two or more interconnected deposition regions within the deposition chamber.

The atomic layer deposition (ALD) apparatus is compatible with integrated circuit fabrication processes. In one integrated circuit fabrication process, a substrate is positioned on a wafer support in an ALD apparatus comprising two or more integrally connected deposition regions. The wafer support with the substrate thereon is then moved into a first one of the integrally connected deposition regions wherein a first monolayer of a first compound is formed on the surface thereof. After the first monolayer of the first compound of formed on the surface of the substrate the wafer support is moved to a second one of the integrally connected deposition regions wherein a second monolayer of a second compound is formed on the first monolayer of the first compound. Thereafter, alternate monolayers of the first and second compounds are deposited one over the other by moving the wafer support with the substrate thereon between the two or more integrally connected deposition regions until a material layer having a desired thickness is formed on the substrate.

BRIEF DESCRIPTION OF THE DRAWINGS

The teachings of the present invention can be readily understood by considering the following detailed description in conjunction with the accompanying drawings, in which.

DETAILED DESCRIPTION

Figure 1:
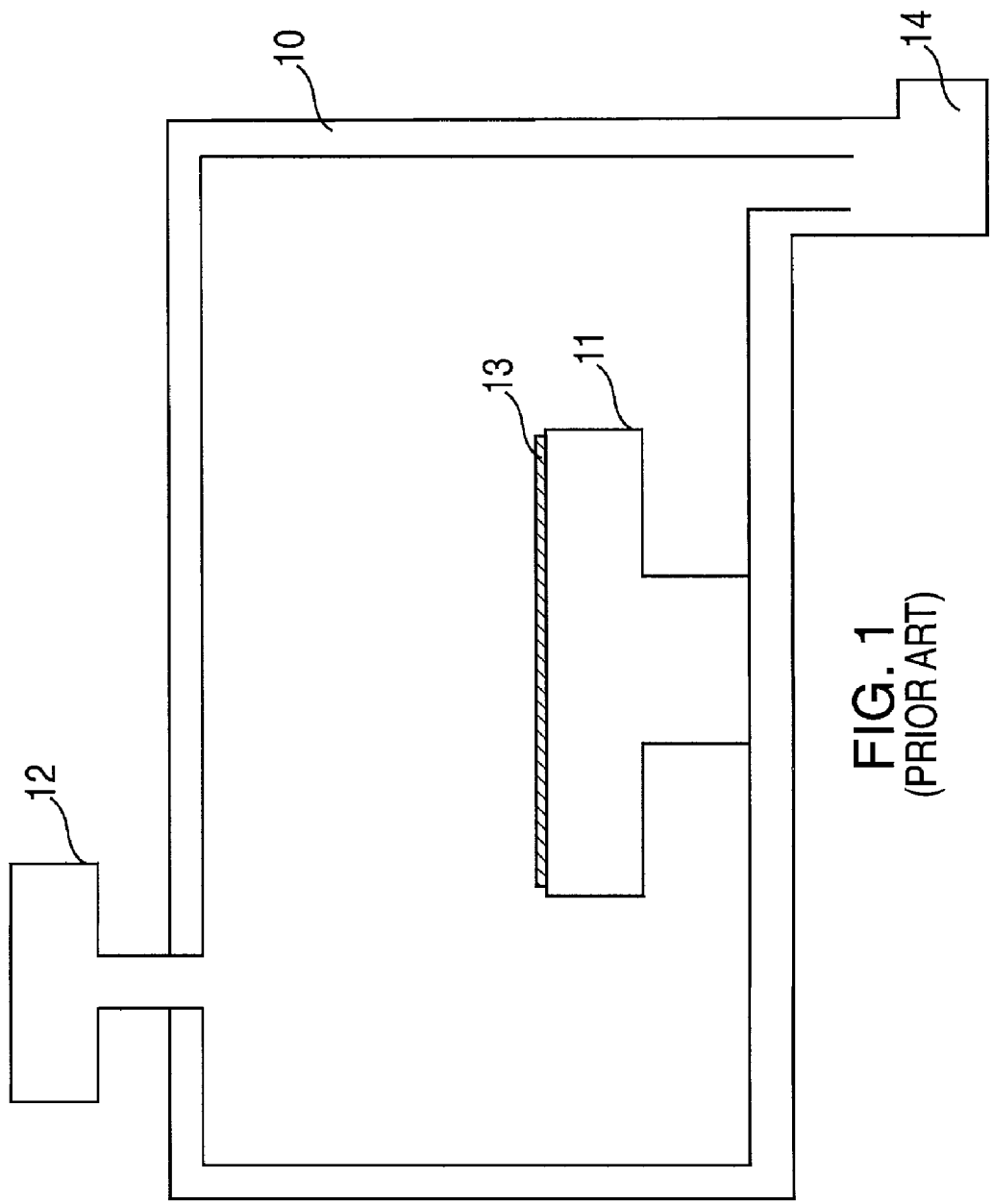
FIG. 1 is a schematic diagram of a prior art atomic layer deposition (ALD) apparatus.
Figure 2:
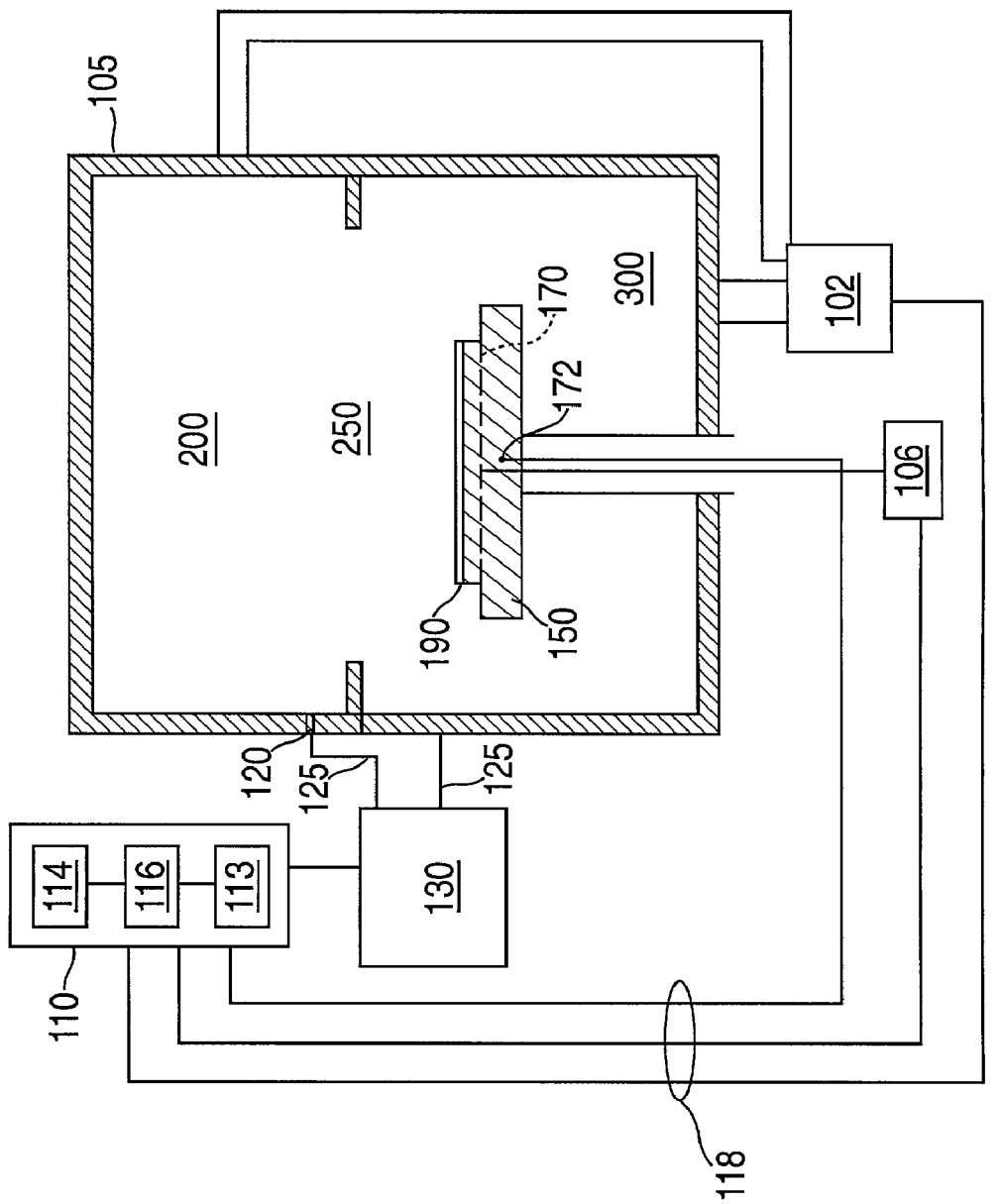
FIG. 2 is a schematic diagram of an atomic layer deposition (ALD) apparatus that can be used for the practice of embodiments described herein.

FIG. 2 is perspective view of an atomic layer deposition (ALD) apparatus 100 that can be used to form a material layer on a semiconductor substrate in accordance with embodiments described herein. The ALD apparatus 100 comprises a deposition chamber 105, a gas panel 130, a control unit 110, along with other hardware components such as power supplies 106 and vacuum pumps 102.

The deposition chamber 105 comprises two or more deposition regions 200, 300 that are integrally connected to each other. In FIG. 2 the two or more deposition regions 200, 300 are configured as one above the other in a vertical arrangement, however it is contemplated that the two or more deposition regions may also be configured in a side by side horizontal arrangement (not shown).

The two or more deposition regions 200, 300 are integrally connected one to another with an aperture 250. The aperture 250 is of a sufficient size to permit the passage therethrough of a wafer support 150 having a substrate thereon.

The aperture 250 is optionally sealed. The aperture is sealed to minimize the intermixing of deposition gases within the two or more deposition regions 200, 300. Physical and/or pressure differences may be used.

Alternatively, an inert gas flow may be used to minimize the intermixing of deposition gases at the aperture 250 between the two or more deposition regions 200, 300. The inert gas flow provides a laminar flow around the area of the aperture 250. The inert gas flow is provided around the area of the aperture 250 through orifices (not shown).

The process chamber 105 houses a wafer support 150, which is used to support a substrate such as a semiconductor wafer 190. The wafer support 150 is moveable inside the chamber 105 between the integrally connected deposition regions 200, 300 using a displacement mechanism (not shown).

Depending on the specific process, the semiconductor wafer 190 can be heated to some desired temperature prior to material layer deposition. For example, wafer support 150 may be heated by an embedded heater element 170. The wafer support 150 may be resistively heated by applying an electric current from an AC power supply 106 to the heater element 170. The wafer 190 is, in turn, heated by the wafer support 150. The wafer support 150 may be an electrostatic chuck.

A temperature sensor 172, such as a thermocouple, may also be embedded in the wafer support 150 to monitor the temperature of the support in a conventional manner. The measured temperature can be used in a feedback loop to control the power supplied to the heater element 170, such that the wafer temperature can be maintained or controlled at a desired temperature which is suitable for the particular process application. The pedestal may optionally be heated using radiant heat (not shown).

A vacuum pump 102 is used to evacuate each of the deposition regions 200, 300 of the process chamber 105 and to maintain the proper gas flows and pressure inside the chamber 105. Orifices 120 provide process gases to each of the one or more deposition regions 200, 300. Each orifice 120 is connected to a gas panel 130 via a gas line 125, which controls and supplies various gases used in different steps of the deposition sequence.

Proper control and regulation of the gas flows through the gas panel 130 is performed by mass flow controllers (not shown) and the control unit 110. Illustratively, the control unit 110 comprises a central processing unit (CPU) 113, as well as support circuitry 114, and memories containing associated control software 116. The control unit 110 is responsible for automated control of the numerous steps required for wafer processing such as movement of the wafer support, gas flow control, temperature control, chamber evacuation, and other steps. Bi-directional communications between the control unit 110 and the various components of the ALD 100 are handled through numerous signal cables collectively referred to as signal buses 118, some of which are illustrated in FIG. 2.

The central processing unit (CPU) 113 may be one of any form of general purpose computer processor that can be used in an industrial setting for controlling process chambers as well as sub-processors. The computer may use any suitable memory, such as random access memory, read only memory, floppy disk drive, hard drive, or any other form of digital storage, local or remote. Various support circuits may be coupled to the CPU for supporting the processor in a conventional manner. Process sequence routines as required may be stored in the memory or executed by a second CPU that is remotely located.

The process sequence routines are executed after the substrate 190 is positioned on the wafer support 150. The process sequence routines, when executed, transform the general purpose computer into a specific process computer that controls the chamber operation so that the deposition process is performed. Alternatively, the chamber operation may be controlled using remotely located hardware, as an application specific integrated circuit or other type of hardware implementation, or a combination of software and hardware.

Figure 3:
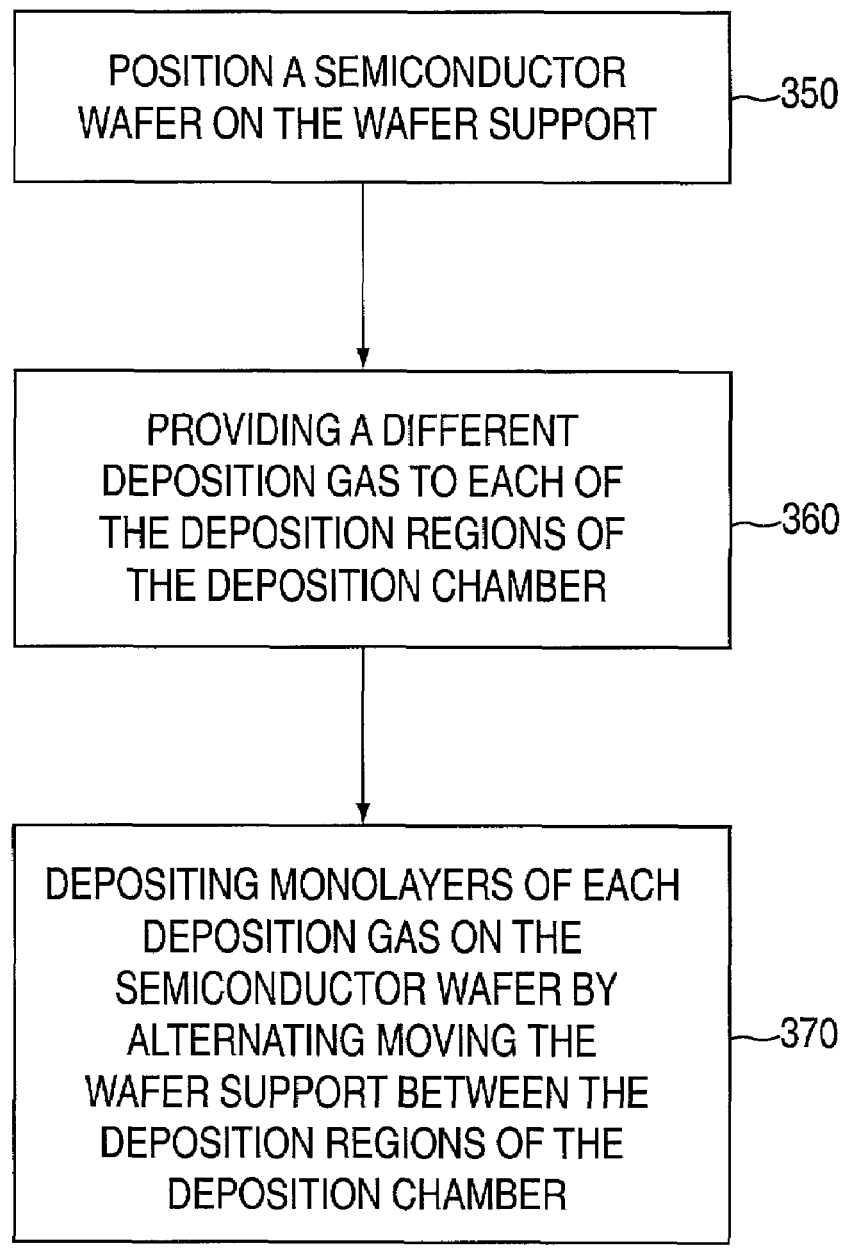
FIG. 3 is a flow diagram of a process sequence for the atomic layer deposition (ALD) apparatus of FIG. 2.

Referring to FIG. 3, the ALD process sequence begins when a semiconductor wafer is positioned on the wafer support in one of the two or more deposition regions 200, 300 of the deposition chamber 105, as indicated in step 350.

After the semiconductor wafer is positioned on the wafer support, a deposition gas is provided to each of the two or more deposition regions 200, 300, as indicated in step 360 of FIG. 3. A different deposition gas is provided to each of the two or more deposition regions 200, 300. The deposition gases may each be provided using a continuous flow, or optionally using a pulsed flow.

Figure 4:
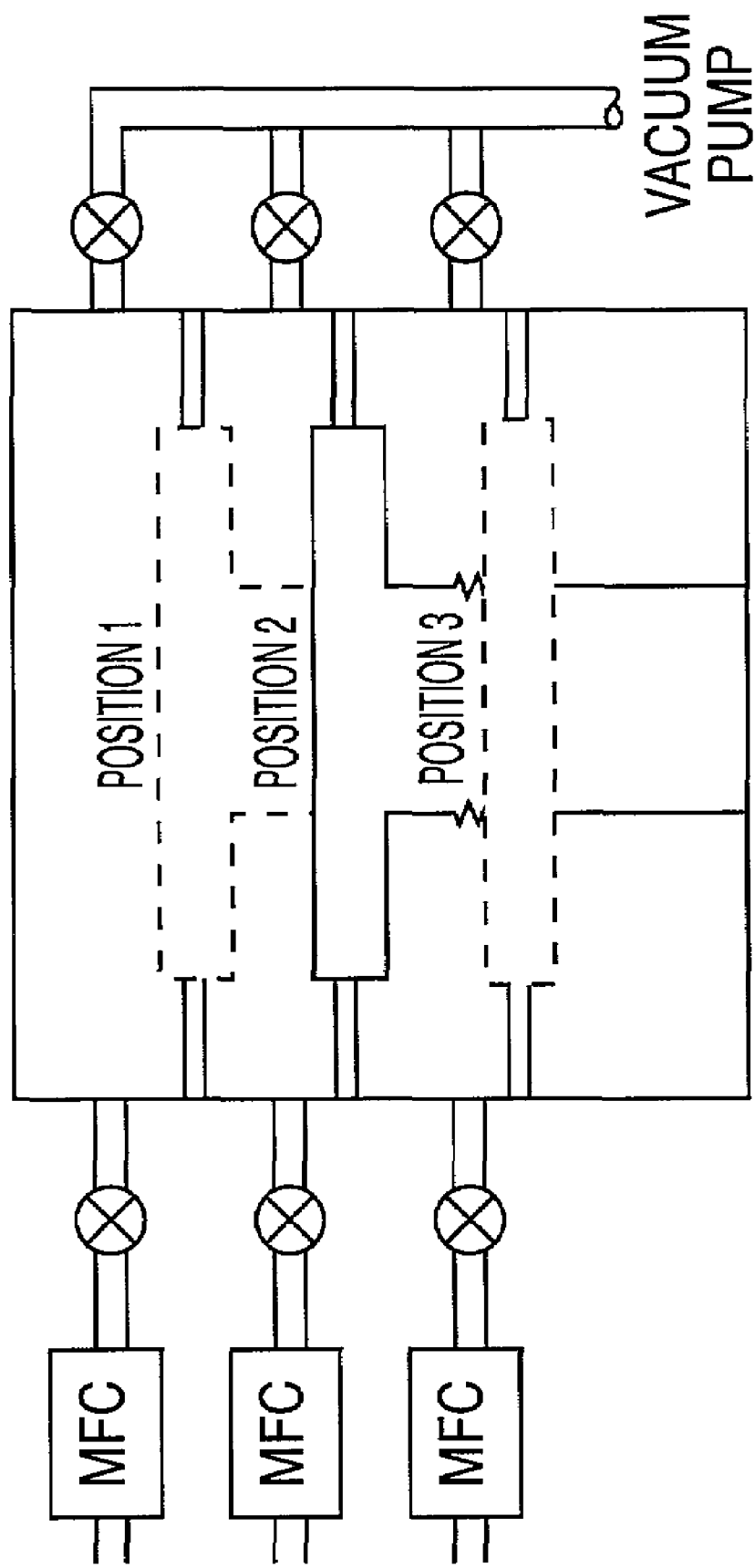
FIG. 4 is a schematic diagram of a second embodiment of an atomic layer deposition (ALD) apparatus that can be used for the practice of embodiments described herein.

Although embodiments described herein refer mainly to an atomic layer deposition chamber having two deposition regions, those skilled in the art will appreciate that, as described, embodiments of the present invention will also encompass deposition chambers having more than two deposition regions. For example, FIG. 4 is a schematic diagram of an ALD apparatus in which a wafer support is capable of movement between more than two positions (Position 1, Position 2 and Position 3) to transport wafers between a plurality of deposition regions within the chamber. Thus while the foregoing is directed to the preferred embodiment of the present invention, other and further embodiments of the invention may be devised without departing from the basic scope thereof, and the scope thereof is determined by the claims which follow.

What is claimed is:

1. An apparatus comprising:
   (a) a deposition chamber, wherein the deposition chamber is divided into two or more deposition regions that are integrally connected to one another; and
   (b) a wafer support disposed in the deposition chamber, wherein the wafer support is moveable between the two or more interconnected deposition regions.

2. The apparatus of claim 1 wherein a piston coupled to the wafer support moves the wafer support between the two or more interconnected deposition regions.

3. The apparatus of claim 1, further comprising a heater wherein the heater is adapted to controls the temperature of the wafer support.

4. The apparatus of claim 1 wherein the wafer support is an electrostatic chuck.

5. The apparatus of claim 1 wherein each of the two or more deposition regions are integrally connected to another of the two or more deposition regions with an aperture.

6. The apparatus of claim 5 wherein the aperture is sealed to minimize the intermixing of deposition gases between the two or more deposition regions.

7. The apparatus of claim 1, further comprising a gas supply panel coupled to the deposition chamber.

8. The apparatus of claim 7 wherein the gas supply panel includes one or more gas supply lines which couple the gas supply panel to the deposition chamber.

9. The apparatus of claim 1, further comprising a gas exhaust pump coupled to the deposition chamber.

10. The apparatus of claim 1, wherein the first and second deposition regions are vertically stacked.

11. The apparatus of claim 1, wherein the chamber further comprises:
    a first orifice adapted to provide process gas to the first deposition region; and
    a second orifice adapted to provide process gas to the second deposition region.

12. The apparatus of claim 11, wherein the first orifice is disposed vertically above the second orifice.

13. A method of depositing a material layer on a substrate comprising:
    (a) positioning a substrate on a wafer support in a deposition chamber comprising a first and second deposition region, wherein the first and second deposition regions are integrally connected to one another, and wherein the wafer support is movable between the first and second deposition regions;
    (b) introducing a first deposition gas into the first deposition region and a second deposition gas into the second deposition region;
    (c) moving the wafer support with the substrate thereon into the first deposition region wherein a first monolayer of the first deposition gas is chemisorbed onto the surface of the substrate;
    (d) changing the elevation of the wafer support to transport the substrate thereon into the second deposition region wherein a first monolayer of the second deposition gas is chemisorbed on the first monolayer of the first deposition gas; and (e) repeating steps (c) and (d) until a material layer having a desired thickness is achieved.

14. A computer storage medium containing a software routine that when executed causes a general purpose computer to control a process chamber using a layer deposition method, comprising:
   (a) positioning a substrate on a wafer support in a deposition chamber comprising a first and second deposition region, wherein the first and second deposition regions are integrally connected to one another, and wherein the wafer support is movable between the first and second deposition regions;
   (b) introducing a first deposition gas into the first deposition region and a second deposition gas into the second deposition region;
   (c) moving the wafer support with the substrate thereon into the first deposition region wherein a first monolayer of the first deposition gas is chemisorbed onto the surface of the substrate;
   (d) changing the elevation of the wafer support to transport the substrate thereon into the second deposition region wherein a first monolayer of the second deposition gas is chemisorbed on the first monolayer of the first deposition gas; and
   (e) repeating steps (c) and (d) until a material layer having a desired thickness is achieved.

15. A method of depositing a material layer on a substrate comprising:
   positioning a substrate on a substrate support in a deposition chamber comprising a first deposition region and a second deposition region, wherein the first and second deposition regions are integrally connected to one another, and wherein the substrate support is moveable between the first and second regions;
   depositing a first monolayer on the substrate disposed on the substrate support in the first deposition region;
   elevating the wafer positioned on the substrate support on the second deposition region; and
   depositing a layer on the substrate in the second deposition region.

16. The method of claim 15 further comprising:
   depositing a second monolayer on the substrate in the second deposition region.

17. The method of claim 15 further comprising:
   introducing a first deposition gas to form the first monolayer in the first deposition region; and
   introducing a second deposition gas to deposit the layer in the second deposition region.

18. The method of claim 17 further comprising:
   flowing a purge gas into at least one of the integrally connected deposition regions between the introduction of the first and second deposition gases.

19. The method of claim 17, wherein the step of moving the wafer positioned on the substrate support to the second deposition region further comprises:
   moving the substrate support vertically.

20. The method of claim 15, wherein the deposition chamber is a vacuum deposition chamber.

21. An apparatus for processing a substrate comprising:
   a deposition chamber wherein the deposition chamber is divided into two or more deposition regions that are integrally connected to one another, at least one of said regions being adapted to support deposition of a monolayer upon a surface of a substrate; and
   a wafer support disposed in the deposition chamber and having a horizontal wafer supporting surface, wherein the wafer support is moveable between two or more interconnected deposition regions, wherein one of said deposition regions is vertically stacked above another of said deposition regions.

22. The apparatus of claim 21 in which said at least one deposition region is adapted to support deposition of a second monolayer.

23. The apparatus of claim 21 in which said at least one deposition region is adapted to support deposition via chemisorption.

24. The apparatus of claim 21, wherein the deposition chamber is a vacuum deposition chamber.

25. An apparatus for processing a substrate, comprising:
   a deposition chamber wherein the deposition chamber is divided into two or more deposition regions that are integrally interconnected to one another, at least one of said deposition regions being adapted to support deposition of a first monolayer upon a surface of a substrate and at least one of said deposition regions being optionally sealable from the other deposition regions, and wherein one of said deposition regions is vertically stacked above another of said deposition regions; and
   a wafer support disposed in the deposition chamber and configured to support the substrate horizontally, wherein the wafer support is moveable between two or more interconnected deposition regions.

26. The apparatus of claim 25 in which said at least one regions are adapted to support deposition of a second monolayer.

27. The apparatus of claim 25 in which at least one of said regions is sealed so as to minimize intermixing of deposition gases within two or more deposition regions.

28. The apparatus of claim 25 in which said chamber further comprises an orifice for each of said deposition regions, each orifice adapted to provide process gas to a respective deposition region.

29. The apparatus of claim 28, in which each orifice is adapted to provide differing process gases.

30. The apparatus of claim 28 in which at least one of said orifices is adapted to provide process gas and purge gas.

31. The apparatus of claim 25 in which said at least one deposition region is adapted to support deposition via chemisorption.

32. The apparatus of claim 25, wherein the deposition chamber is a vacuum deposition chamber.

33. An apparatus for processing a substrate, comprising:
   a deposition chamber body having a sealable port configured for horizontal entry and egress of a substrate;
   at least two or more deposition regions defined in the chamber body, at least a first deposition region of said deposition regions is adapted to support vertical deposition of a first monolayer upon a surface of a substrate, wherein one of said deposition regions is vertically stacked above another of said deposition regions; and
   a wafer support disposed in the deposition chamber, wherein the wafer support is moveable between two or more interconnected deposition regions.

34. The apparatus of claim 33, wherein at least one of said deposition regions is sealable from the other deposition regions.

35. The apparatus of claim 33, wherein said at least a second deposition region is adapted to support deposition of a second monolayer.

36. The apparatus of claim 33 in which at least one of said regions is sealed so as to minimize intermixing of deposition gases within two or more deposition regions.

37. The apparatus of claim 33 in which said chamber further comprises an orifice for each of said deposition regions, each orifice adapted to provide process gas to a respective deposition region.

38. The apparatus of claim 37, in which each orifice is adapted to provide differing process gases.

39. The apparatus of claim 33, wherein the deposition chamber is a vacuum deposition chamber.

* * * * *

UNITED STATES PATENT AND TRADEMARK OFFICE
CERTIFICATE OF CORRECTION

PATENT NO. : 7,085,616 B2
APPLICATION NO. : 09/917842
DATED : August 1, 2006
INVENTOR(S) : Chin et al.

Page 1 of 1

It is certified that error appears in the above-identified patent and that said Letters Patent is hereby corrected as shown below:

In column 3, line 21, delete "processing such" and insert -- processing–such --, therefor.

In column 3, line 60, below "pulsed flow." insert -- Thereafter as indicated in step 370 of FIG. 3, alternating monolayers of each deposition gas are chemisorbed onto the surface of the semiconductor wafer to form a material layer having a desired thickness thereon. Each monolayer is chemisorbed onto the surface of the semiconductor wafer as the wafer support is alternately moved between the two or more deposition regions through aperture 250. --, as a new paragraph.

In column 4, line 10, in Claim 1, delete "a deposition" and insert -- a vacuum deposition --, therefor.

In column 4, line 14, in Claim 1, after "support is" insert -- vertically --.

In column 4, line 20, in Claim 3, delete "controls" and insert -- control --, therefor.

In column 5, line 38, in Claim 15, after "support" delete "on" and insert -- to --, therefor.

Signed and Sealed this

Seventeenth Day of April, 2007

JON W. DUDAS
*Director of the United States Patent and Trademark Office*